United States Patent
Odell et al.

(10) Patent No.: US 9,490,842 B2
(45) Date of Patent: Nov. 8, 2016

(54) CONTINUOUS AUTOMATIC KEY CONTROL

(75) Inventors: Daniel L. Odell, Kirkland, WA (US); Joshua E. Baber, Seattle, WA (US); Nathan C. Sherman, Bellevue, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 848 days.

(21) Appl. No.: 13/560,564

(22) Filed: Jul. 27, 2012

(65) Prior Publication Data

US 2012/0295711 A1    Nov. 22, 2012

Related U.S. Application Data

(63) Continuation of application No. 12/196,319, filed on Aug. 22, 2008, now Pat. No. 8,264,381.

(51) Int. Cl.
*H03M 11/14* (2006.01)
*H03M 11/00* (2006.01)
*H03K 17/94* (2006.01)

(52) U.S. Cl.
CPC .............. *H03M 11/14* (2013.01); *H03K 17/94* (2013.01); *H03M 11/00* (2013.01)

(58) Field of Classification Search
CPC ...... H03M 11/00; H03M 11/14; H03K 17/94
USPC ............ 341/22, 29; 345/156, 163, 168, 172; 463/37
See application file for complete search history.

(56) References Cited

U.S. PATENT DOCUMENTS

| | | | |
|---|---|---|---|
| 3,781,874 A * | 12/1973 | Jennings | 341/26 |
| 4,323,888 A | 4/1982 | Cole | |
| 4,480,519 A * | 11/1984 | Allen | G10H 1/18 84/423 A |
| 4,514,732 A * | 4/1985 | Hayes, Jr. | 340/12.1 |
| 4,609,908 A | 9/1986 | Amano | |
| 4,617,554 A | 10/1986 | Krause et al. | |
| 5,088,378 A * | 2/1992 | DeLaTorre | G10H 1/34 84/423 R |
| 5,438,331 A | 8/1995 | Gilligan et al. | |
| 5,660,488 A | 8/1997 | Miller | |

(Continued)

FOREIGN PATENT DOCUMENTS

WO    WO-2004059422    7/2004

OTHER PUBLICATIONS

"Configuring the Keyboard", http://library.gnome.org/userslgnome-access-guide/latest/dtconfig-11.html.en, (Jun. 19, 2008), 4 Pages.
"Final Office Action", U.S. Appl. No. 12/196,319, (Jan. 6, 2012), 6 pages.
"Non-Final Office Action", U.S. Appl. No. 12/196,319, (Oct. 13, 2011), 5 pages.

(Continued)

*Primary Examiner* — Benjamin C Lee
*Assistant Examiner* — Stephen Burgdorf
(74) *Attorney, Agent, or Firm* — Qudus Olaniran; Judy Yee; Micky Minhas

(57) ABSTRACT

Architecture for enabling continuous operation of a control command issued by a control input (e.g., a control key on a computer keyboard or game controller). For example, for a user of a software application (e.g., a gaming application), an activation modifier is used for enabling continuous operation of the control command. The activation modifier can be a lock key or other type of input used in combination with the control key. During continuous operation of the control command, one or more alternate control inputs (e.g., from alternate control keys) are enabled to concurrently issue alternate control commands to the software application.

20 Claims, 8 Drawing Sheets

(56) References Cited

U.S. PATENT DOCUMENTS

| | | | |
|---|---|---|---|
| 5,759,100 | A | 6/1998 | Nakanishi |
| 5,874,906 | A | 2/1999 | Willner et al. |
| 6,071,194 | A | 6/2000 | Sanderson et al. |
| 6,722,984 | B1 | 4/2004 | Sweeney, Jr. et al. |
| 8,264,381 | B2 | 9/2012 | Odell |
| 2003/0144044 | A1 | 7/2003 | Pisarsky |
| 2006/0218492 | A1* | 9/2006 | Andrade ........................ 715/523 |
| 2007/0013660 | A1* | 1/2007 | Sherman ........................ 345/163 |
| 2007/0109325 | A1 | 5/2007 | Eveleigh |
| 2007/0168647 | A1* | 7/2007 | Wilson et al. .................. 712/34 |
| 2007/0234223 | A1* | 10/2007 | Leavitt et al. ................. 715/762 |
| 2007/0242049 | A1* | 10/2007 | Kim ............................ 345/172 |
| 2010/0045490 | A1 | 2/2010 | Odell et al. |

OTHER PUBLICATIONS

"Notice of Allowance", U.S. Appl. No. 12/196,319 (May 15, 2012), 6 pages.

"ReMapping a Joystick to keyboard or mouse", http://www.autohotkey.com/docs/misc/RemapJoystick.htm, (Jun. 19, 2008), 3 Pages.

Diment, "The Executive Computer; A Tune Up for the PC's Keyboard", http://query.nytimes.com/gst/fullpage.html?res=9A0DE4D61731F93AA25753C1A960948260&sec=technology&spon=&pagewanted=all, (Oct. 19, 1986), 3 Pages.

Freeman, et al., "Information Builders", <<http://www.informationbuilders.com/new/tfc/fall2003/advanced_techniques.html>>, (Jun. 19, 2008), 5 Pages.

* cited by examiner

CONTINUOUS AUTOMATIC KEY CONTROL

RELATED APPLICATION

This application is a continuation of and claims priority to U.S. patent application Ser. No. 12/196,319, filed on Aug. 22, 2008, the disclosure of which is incorporated by reference herein.

BACKGROUND

In certain software applications, particularly gaming applications, keyboard or keypad input tends to be more intense than in standard applications. Depending on the specific game, repeated commands are often desired to be issued frequently, continuously, and/or rapidly.

In gaming applications, examples of continuous input include running forward over long distances (e.g., holding down the "w" key), and continuing to hold down the "jump" button (e.g., the spacebar in first person shooter games) to avoid fire. In games with large maps over which a game character is moved, running forward with the "w" key requires that the finger be depressed on the key for a long period of time. It can become uncomfortable to hold down a static load with a finger for such a long period of time. Examples of rapid, repeated input can include spell casting, attacks (e.g., shooting, running), and the like. Thus, issuing repetitive commands over a period of time also can be fatiguing and uncomfortable.

Additionally, issuing repetitive commands requires the player's hands to remain in specific regions of the keyboard. For many games, movement commands are issued with the left hand and pointing and shooting is performed with the right hand (e.g., using a mouse or other areas of the keyboard). This can limit the ability of the hand to reach other regions of the keyboard (and the number of fingers available) to enter other commands. This restricts the other keys that can be used during gameplay.

Further, if the hands are moved to access other keys, it can be difficult for the player to quickly return to the original keys, which can affect the gameplay (e.g., the game character cannot be moved quickly enough to avoid an enemy attack).

SUMMARY

The following presents a simplified summary in order to provide a basic understanding of some novel embodiments described herein. This summary is not an extensive overview, and it is not intended to identify key/critical elements or to delineate the scope thereof. Its sole purpose is to present some concepts in a simplified form as a prelude to the more detailed description that is presented later.

To that end, architecture is disclosed herein for control operation of one or more control inputs each used for issuing a control command to a software application, which can be a gaming software application. An activation modifier enables continuous operation of the control command. The activation modifier also enables an alternate control input to concurrently issue an alternate control command to the software application. The control input and alternate control input can be keys used on a keyboard, keypad, game controller or other suitable input device used with a computer system.

To the accomplishment of the foregoing and related ends, certain illustrative aspects are described herein in connection with the following description and the annexed drawings. These aspects are indicative of the various ways in which the principles disclosed herein can be practiced, all aspects and equivalents of which are intended to be within the scope of the claimed subject matter. Other advantages and novel features will become apparent from the following detailed description when considered in conjunction with the drawings.

DETAILED DESCRIPTION

Figure 1:
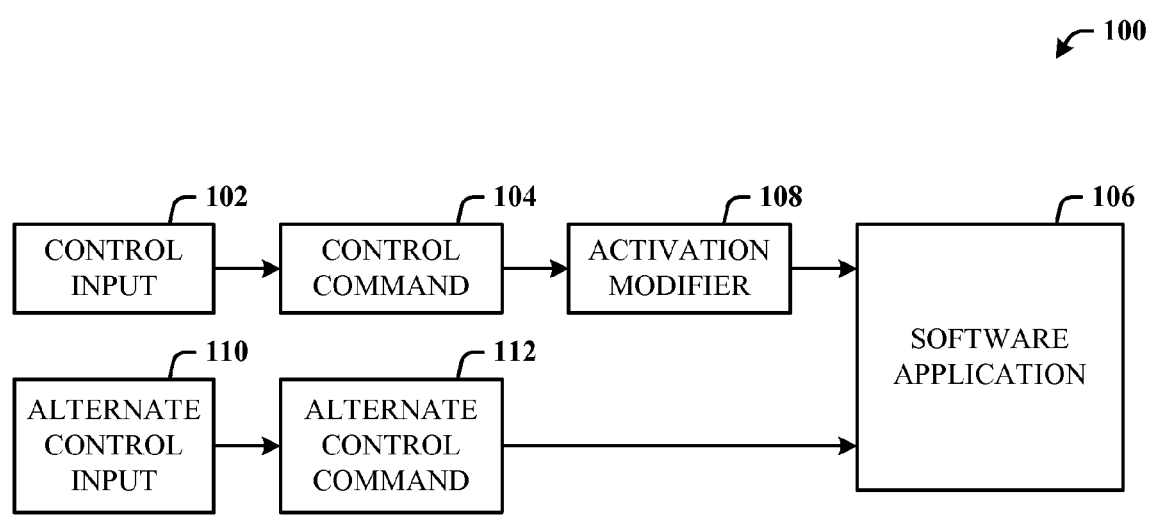
FIG. 1 illustrates a control operation system for enabling continuous operation of a control command.

The disclosed architecture relates to a control operation system of an input device for enabling continuous operation of a control command issued by a control input (e.g., a control key on a computer keyboard, game controller, keypad, etc.). For example, for a user of a software application (e.g., a gaming application), an activation modifier (e.g., key, key combination, press pattern, etc.) is used for enabling continuous operation of the control command. The activation modifier can be a lock key or other type of input used in combination with the control key. During continuous operation of the control command, one or more alternate control inputs (e.g., from alternate control keys) are enabled to concurrently issue alternate control commands to the software application.

Reference is now made to the drawings, wherein like reference numerals are used to refer to like elements throughout. In the following description, for purposes of explanation, numerous specific details are set forth in order to provide a thorough understanding thereof. It may be evident, however, that the novel embodiments can be practiced without these specific details. In other instances, well known structures and devices are shown in block diagram form in order to facilitate a description thereof. The intention is to cover all modifications, equivalents, and alternatives falling within the spirit and scope of the claimed subject matter.

FIG. 1 illustrates a control operation system 100 for enabling continuous operation of a control command 104. A control input 102 is used for issuing the control command 104 to a software application 106. The software application 106 can be a software application such as a gaming application including an interactive game character in which the control command affects the action or behavior of the game character, as displayed on an output component such as a monitor. However, the software application can be any suitable application to which a continuous command may be issued.

As illustrated in FIG. 1, an activation modifier 108 is provided for enabling continuous operation of the control command 104. During continuous operation of the control command 104, an alternate control input 110 is enabled to concurrently issue an alternate control command 112 to the software application 106. In this way, the continuous operation of the control command 104 does not interfere with the operation of other inputs. The control command 104 is thus continuously issued independently and without interference of any other control inputs until such a time as continuous operation is discontinued, as will be discussed in greater detail hereinbelow.

Note that the system 100 can be employed not only with binary on/off controls, such as keyboard keys, for example, but also with non-binary variables associated with value-based control such as speed of movement, rate of increase, rate of decrease, rate of jump, etc. An alternative to tactile enablement is by voice control, or a signal from another device (e.g., foot pedal, mouse button, etc.), which can also be employed in combination with key control (e.g., voice control and a key press).

Figure 2:
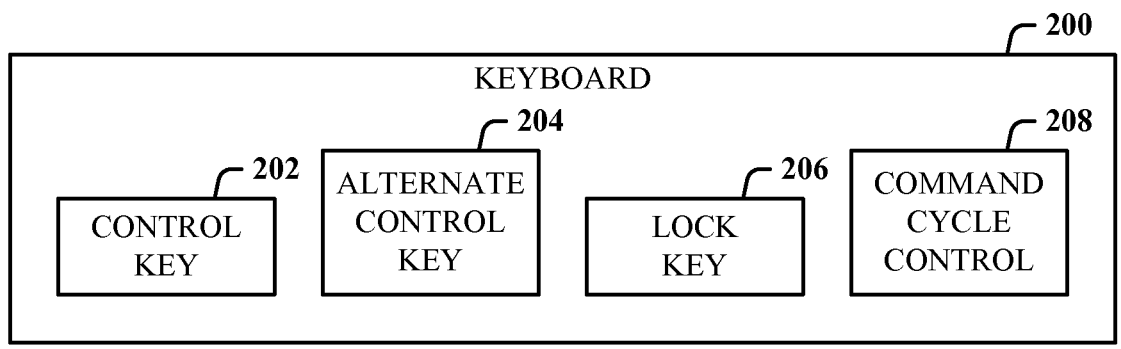
FIG. 2 illustrates an alternative embodiment of the control operation system including a keyboard having keys for enabling continuous operation of the control command, including additional exemplary aspects.

FIG. 2 illustrates an alternative embodiment of the control operation system including a keyboard 200 (or similar input device such as a game controller, keypad, multi-key multi-function mouse, etc.) having keys for enabling continuous operation of the control command, including additional exemplary aspects. In this embodiment, the control input 102 (of FIG. 1) is a control key 202 and the alternate control input 110 is an alternate control key 204. The keyboard 200 can be a computer keyboard and, the control key 202 and alternate control key 204 are keys included on the keyboard 200.

It is to be appreciated that the control key 202 can be any key on the keyboard 200 used to issue a command in the software application 106. For example, the control key 202 can be the "w" key used to issue a "move forward" command in a gaming application. However, it is to be appreciated that the control key 202 can be any other suitable key, such as a spacebar used to issue a "jump" command, or the like, since a user may program the application to recognize a "move forward" action from most any keyboard key.

Similarly, the alternate control key 204 can be any key on the keyboard 200 used to issue a command in the software application 106. In the hereinabove example, if the control key 202 is the "w" key used to issue a "move forward" command in a gaming application, the alternate control key 204 can be the spacebar used to issue a "jump" command, for example. In this way, when continuous operation is enabled on the "w" key to move forward, manual control of the spacebar is permitted without interference.

It is to be appreciated that the control input 102 is not limited to the control key 202 on the computer keyboard 200, but can be incorporated into any suitable user interface, including a mouse, a joystick, a voice controller, foot pedal, a control pad on a handheld computer unit or cellular phone, or any other suitable user input component.

As illustrated in FIG. 2, the activation modifier 108 can be a lock key 206 used in combination with the control key 202 or other control input 102 for enabling continuous operation of the control command 104. The lock key 206 locks the function of the control input 102 until specifically discontinued by the user, as described in detail herein below.

The lock key 206 can be a key on the computer keyboard 200. The lock key 206 can be a dedicated key on a specifically-designed gaming keyboard. The lock key 206 can also be a designated key on a standard-purpose computer keyboard. As a designated key, it may be designated by the user within the gaming application, or can be selectively programmable through device driver settings, either within a computer operating system and/or through keyboard firmware.

The lock key 206 can also be used to mechanically lock down the control key 202, so as to physically deliver a continuous signal from the control key 202. The activation modifier 108 can also be implemented in software device drivers within the computer, so as to receive keyboard signals and process a continuous operation of the control command 104 without any specific interaction from the keyboard 200 or its associated firmware.

The lock key 206 can also be used with any suitable user interface, including a designated button on a mouse, a joystick, voice controller, foot pedal, control pad on a handheld unit or cellular phone, or any other suitable user input component. A lock key 206 in the form of any of these user input components can be used with any combination of input components used for the control input 102, as mentioned hereinabove.

Additional embodiments of the activation modifier 108 are also contemplated. In one aspect, a predetermined pattern for pressing the control key 202 can be employed. For example, the activation modifier 108 can be a code representing a predetermined sequence of key presses (e.g., a "Morse code" type signal) where the presses vary in duration (or dwell). In another aspect, the activation modifier 108 can be based on pressure-detection of the control key 202 (a pressure-sensitive key). For example, an especially hard press (and perhaps in combination with duration of the press) of the control key 202 can be detected for enabling continuous operation. In still another aspect, a key combination of the control key 202 with one or more other predetermined keys can be used as the activation modifier 108. In this key combination, the keys can be pressed in combination or in a predetermined sequence in order to enable continuous operation.

In one aspect, the term "continuous operation" of the control command as used herein can include issuing the control command as if the control input 102 were being continuously depressed. In the embodiments in which the control input 102 is the control key 202, the control command 104 is issued from the keyboard 200 as though the control key 202 is continuously held down by the user, even though the control key 202 has been physically released. This mode of continuous operation can be referred to as a "cruise control" mode.

For example, if the user is playing a game and desires to run forward over a long distance, the user employs the activation modifier 108 in combination with the "w" key to enable cruise control. The keyboard 200 continues to issue the "move forward" as if the "w" key were being held down. This allows the user to relax or focus attention on other commands.

In another aspect, the term "continuous operation" of the control command as used herein can include issuing the control command 104 as if the control input 102 were being pressed and released repeatedly in a predetermined command cycle. In the embodiments in which the control input 102 is the control key 202, the control command 104 is issued from the keyboard 200 as though the control key 202 is continuously pressed and released, even though the control key 202 has been physically released. This mode of continuous operation can be referred to as "turbo" mode.

For example, if a player wants to repeatedly perform the same action, the activation modifier 108 is used in combination with the desired key to establish turbo mode. The keyboard 200 then continues to issue the control command 104 as if it were being repeatedly pressed and released.

In turbo mode, the control command 104 can be issued faster than in cruise control mode. For example, if turbo mode is activated on a "fire" control key 202 (a key that is mapped to the "fire" command in the game application), that control command 104 can issue at a rate faster than if the control key 202 is simply held down. Similarly, turbo mode can also enable the control command 104 to be issued more slowly than if the key were to be held down.

As illustrated in FIG. 2, a command cycle control 208 can be used for varying a rate at which a command cycle is repeated. In turbo mode, the command cycle is used to establish the rate at which the control command 104 is issued, and for varying a rate at which the command cycle is repeated. This command cycle control 208 can be adjusted to issue the command faster or slower than the rate of holding down the control key 202.

The control command 104 can also be issued in a periodic burst cycle, for example, having a predetermined number of commands that are quickly issued in a burst followed by a pause, after which the cycle repeats. The command cycle control 208 can also adjust the periodic burst cycle by defining a rate and number of command bursts and also the interval of a pause between bursts.

For embodiments in which the lock key 206 is used to enable continuous operation, it is to be appreciated that a first dedicated lock key 206 can be used to designate "cruise control" mode and a second dedicated lock key 206 can be used to designate "turbo" mode. Additionally, a key can be used for the command cycle control 208. Alternatively, "cruise control" and "turbo" modes can be any other selectively programmed keys, combination of keys, buttons, or other switch-activated controls or other controls on a user interface, or any sequence, pattern or combination of key presses, as described hereinabove.

Figure 3:
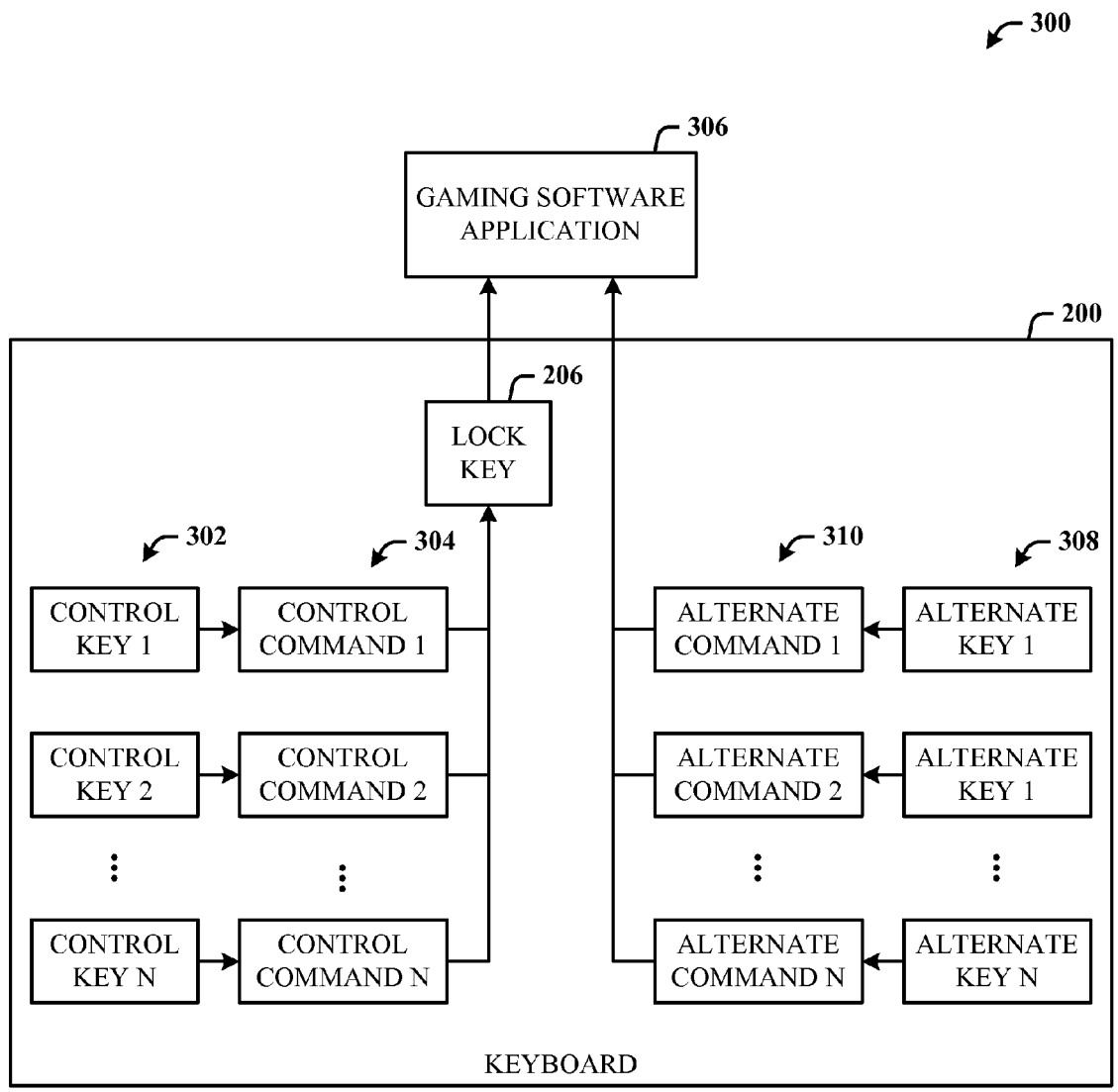
FIG. 3 illustrates a further alternative embodiment of the control operation system including a keyboard having keys for enabling continuous operation of the control command, including additional exemplary aspects.

FIG. 3 illustrates a further alternative embodiment of a control operation system 300 including the keyboard 200 having keys for enabling continuous operation of the control command 104, including additional exemplary aspects. The control operation system 300 includes the keyboard 200 having a key arrangement that includes control keys 302 for issuing control commands 304 to a gaming software application 306. The lock key 206 is used in combination with the control keys 302 for enabling continuous operation of one or more of the control commands 304. The lock key 206 enables alternate control keys 308 to concurrently issue alternate control commands 310 to the gaming software application 306.

As illustrated in FIG. 3, the keyboard 200 can be a computer keyboard (e.g. a "QWERTY" keyboard or the like). The keyboard 200 can have a number of keys, any of which can be used as the control keys 302 for issuing commands in the gaming software application 306 (e.g., for moving a game character, jumping, firing, or other functions). The gaming application 306 can be any type of gaming application, for example, first-person shooter, real-time strategy, etc.

Figure 4:
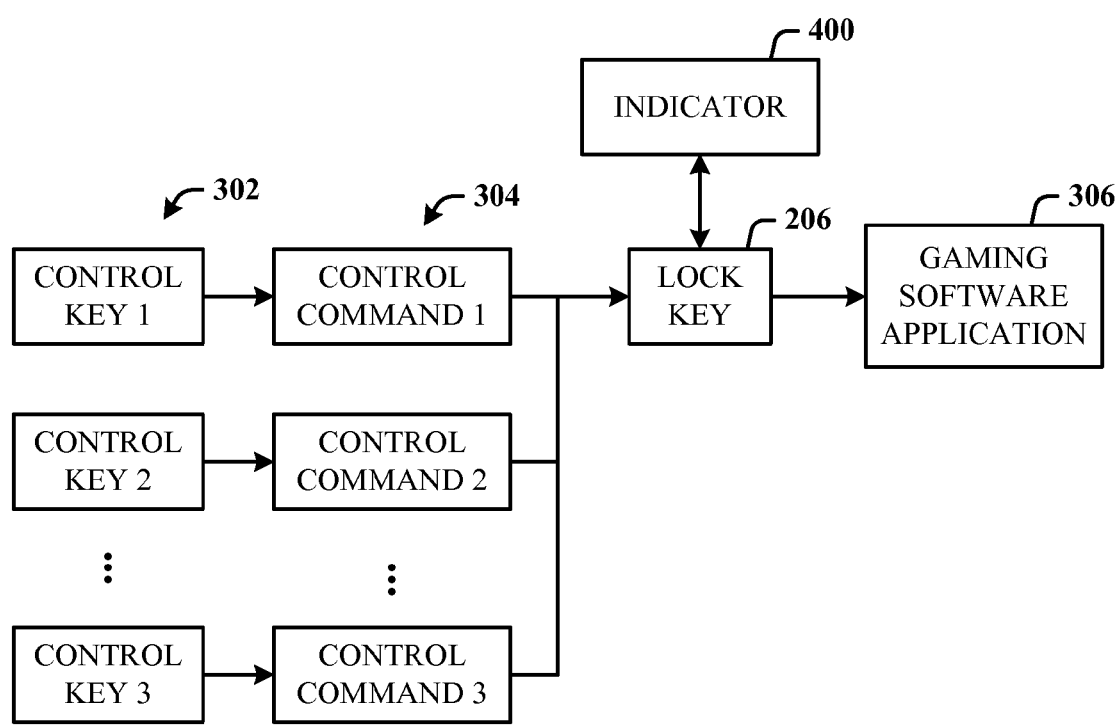
FIG. 4 illustrates an additional alternative embodiment of the control operation system including keys and an indicator for indicating continuous operation of the control command.

FIG. 4 illustrates an additional alternative embodiment 400 of the control operation system including control keys 302 and an indicator 402 for indicating whether continuous operation of the control command 304 is enabled. The indicator 402 can be an indicator light (e.g., an LED) which can be located on the keyboard 200. The indicator light can also be installed within the lock key 206, so as to light up when continuous operation is enabled.

In a dedicated gaming computer keyboard, the control keys 302 can each have a light installed therein. The control keys 302 can each light up when in continuous operation, for example. In the event that more than one of the control keys 302 is in continuous operation, multiple lights on the respective keys can provide a visual indication of which control commands are being continuously issued. In turbo mode, the lights can have a blink rate associated with the speed of the command cycle, for example.

The indicator 402 can alternatively include an onscreen indicator, such as an icon displayed as an onscreen overlay on a side or in a corner of the screen on the gaming interface. The icon can be a graphical or alphanumeric display element to provide a symbol or name of the commands being continuously issued. The icon can be displayed as a discrete visual component of the gaming software application 306 configured to receive continuous operation information from the keyboard 200.

The indicator 402 can alternatively include an audio feedback indicator. This audio feedback can be in the form of a continuous or intermittent tone. The audio feedback can be different in accordance with the control commands 304 being continuously issued. If multiple control commands 304 are being continuously issued, different audio feedback can be concurrently issued. Different tones can be issued in a sequence resulting in a chord or a melody corresponding to various control commands operating concurrently. In a more robust implementation, the audio feedback can be a short audio clip (e.g., "activating continuous run mode") played back to the user via an audio output device (e.g., piezoresistive speaker) on the keyboard, or via a headset the user employs for play and/or communications.

As mentioned with respect to other embodiments hereinabove, the control command 104 can be issued according to continuous operation based on a variable rate. The variable rate of continuous operation can include a variable rate of press and release cycles of the control keys 302.

Additionally, continuous operation can be implemented by a timer and operate for a desired period of time. For example, for a "fire" command, turbo mode can be implemented to lock down the fire key for thirty seconds or other suitable period. A timer function can be used to define a press/release interval for the control key 202. A timer function can be used to define a dwell interval for the keys, to measure the length of time a key is depressed to register a command. For example, the dwell time can be 250 milliseconds to isolate a break of contact.

Included herein is a set of flow charts representative of exemplary methodologies for performing novel aspects of the disclosed architecture. While, for purposes of simplicity of explanation, the one or more methodologies shown herein, for example, in the form of a flow chart or flow diagram, are shown and described as a series of acts, it is to be understood and appreciated that the methodologies are not limited by the order of acts, as some acts may, in accordance therewith, occur in a different order and/or concurrently with other acts from that shown and described herein. For example, those skilled in the art will understand and appreciate that a methodology could alternatively be represented as a series of interrelated states or events, such as in a state diagram. Moreover, not all acts illustrated in a methodology may be required for a novel implementation.

Figure 5:
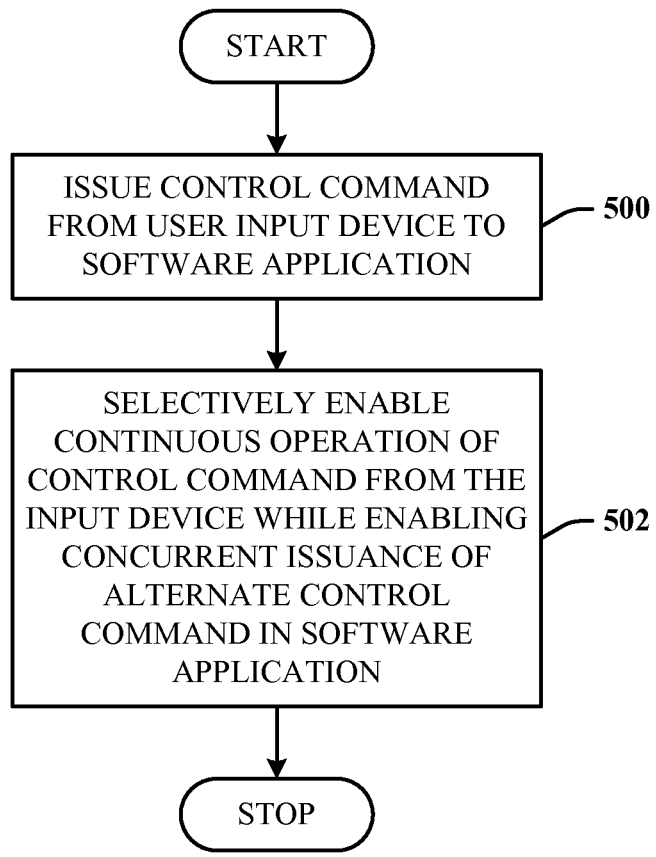
FIG. 5 illustrates an exemplary method of dynamic control.

FIG. 5 illustrates an exemplary method of dynamic control. At 500, a control command is issued from a user input device to a software application. The control command can be issued by any suitable control input, such as a control key or other input from a user interface component. At 502, continuous operation of the control command is selectively enabled from the input device while enabling concurrent issuance of an alternate control command to the software application. In this way, the control command can operate automatically while allowing the user to manually enter other commands into the system with the control input. The continuous operation of the control command and the manual operation of the alternate control commands do not interfere with each other.

Figure 6:
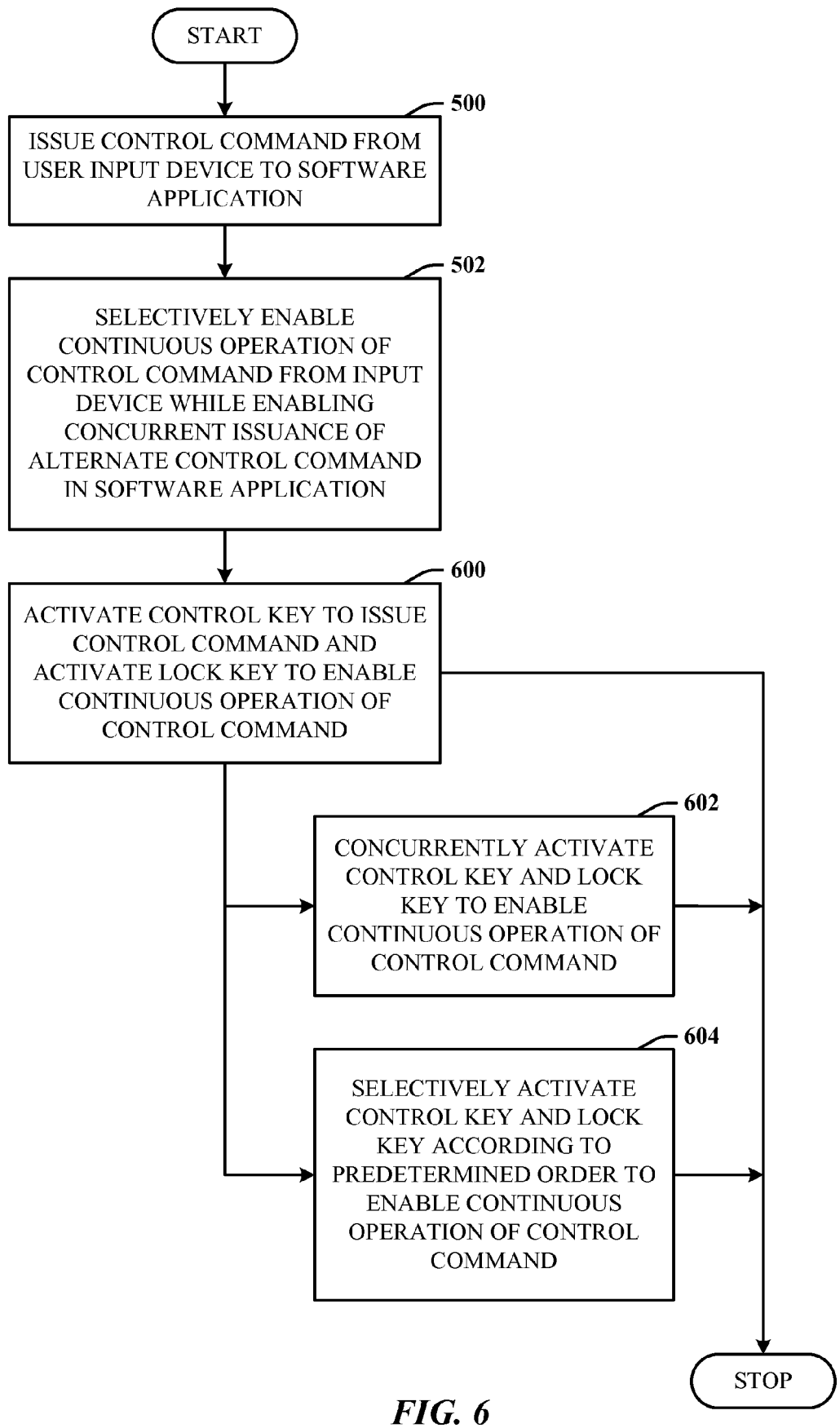
FIG. 6 illustrates further exemplary aspects of enabling continuous operation in the method of dynamic control.

FIG. 6 illustrates further exemplary aspects of enabling continuous operation in the method of dynamic control. Flow begins with the steps defined in FIG. 5, where at 500, a control command is issued to a software application from the user input device, and at 502, continuous operation of the control command can be selectively enabled at the input device while enabling concurrent issuance of an alternate control command to the software application. At 600, a control key is activated to issue the control command and a lock key is activated to enable continuous operation of the control command. The control key can be a key designated for issuing the control command. The lock key can be a key on a standard computer keyboard or it can be a dedicated key on a proprietary keyboard or other suitable interface such as a keypad, game controller, mouse, etc.

At 602, the control key and the lock key are concurrently activated to enable continuous operation of the control command. In other words, the control key and the lock key are pressed together in order to activate continuous operation. It can also be the case that the result can be achieved by sequentially pressing the keys within a predetermined time period (e.g., one second) and in a predetermined order.

Alternatively, at 604, the control key and the lock key are selectively activated according to a predetermined order to enable continuous operation of the control command. In other words, the control key can be pressed first, followed by the lock key, or the lock key can be pressed first, followed by the control key.

Figure 7:
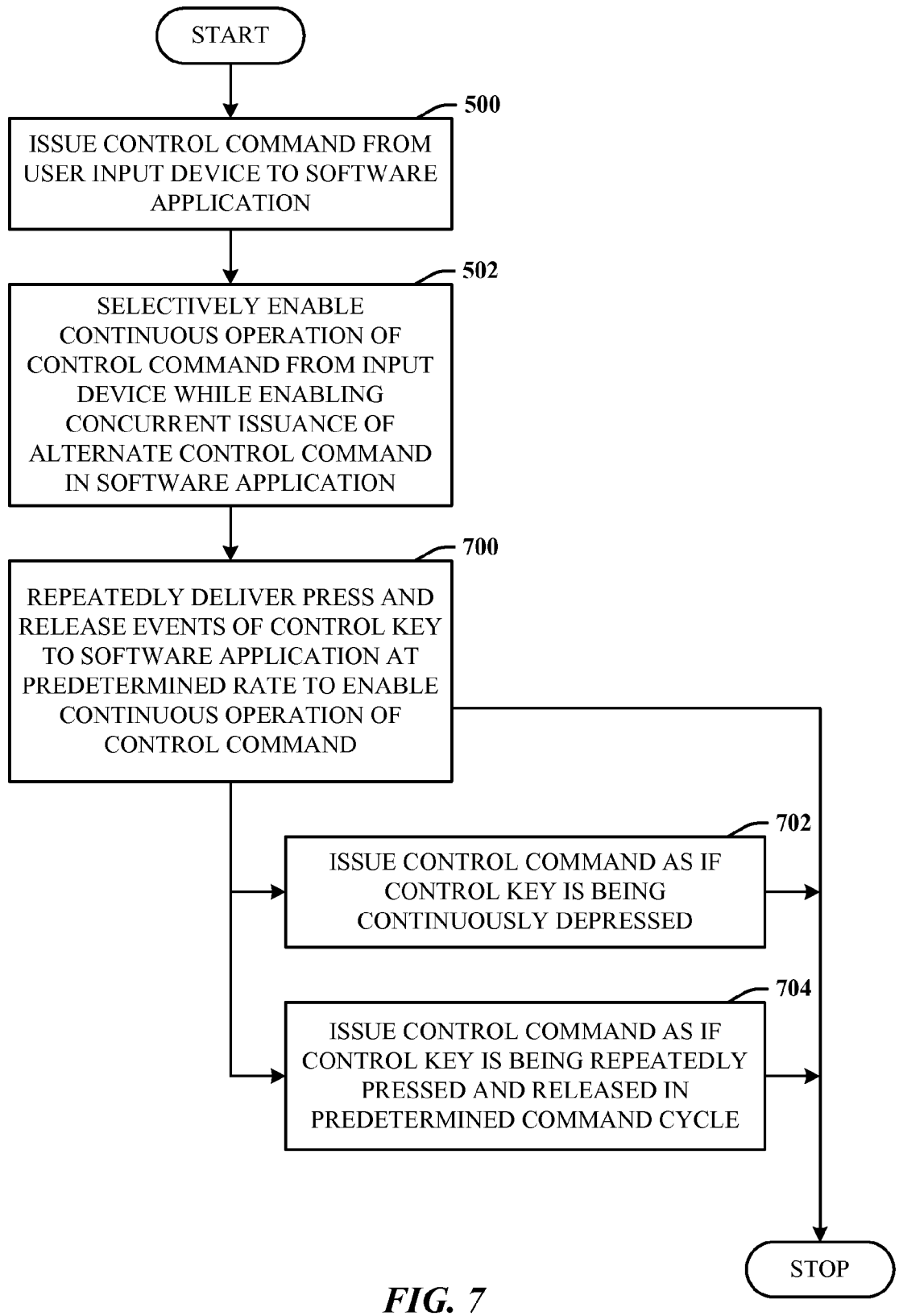
FIG. 7 illustrates additional exemplary aspects of enabling continuous operation in the method of dynamic control.

FIG. 7 illustrates additional exemplary aspects of enabling continuous operation in the method of dynamic control. Flow begins with the steps defined in FIG. 5, where at 500, a control command is issued to a software application from the user input device, and at 502, continuous operation of the control command is selectively enabled from the input device while enabling concurrent issuance of an alternate control command to the software application. At 700, press and release events of a control key are repeatedly delivered to the software application at a predetermined rate to enable continuous operation of the control command.

At 702, the control command is issued as if the control key is being continuously depressed. This state of continuous operation corresponds to cruise control mode, as described hereinabove.

At 704, the control command is issued as if the control key is being repeatedly pressed and released in a predetermined command cycle. This state of continuous operation corresponds to turbo mode, as mentioned hereinabove.

A description follows of an exemplary implementation of the continuous operation of the control command 104, including various additional aspects. The control key 202 can be placed in cruise control mode by alternate events. One or more of the control keys 302 are pressed and maintained, and then a cruise control lock control is activated (e.g., by button or lock key 206). Alternatively, the cruise control lock control is activated and maintained, and then one or more of the control keys 302 are pressed.

Either of the aforementioned sequences can be used to place the selected control key 302 in continuous operation. During continuous operation, the notification from the keyboard 200 that the control key 202 has been released is suppressed by the system. In this way, the system interprets the keyboard signal as a continuous press, as though the control key 202 is being continuously held down. Concurrent activation of the control key 202 and cruise control lock can be resolved as either of the two above cases.

As used herein, "pressed and maintained" means either that the control command 104 is issued, then the activation modifier 108 is implemented, or else that the activation modifier 108 is implemented first, and then the control command 104. It is to be appreciated that multiple control commands can be placed in cruise control or turbo modes at the same time.

As described hereinabove, continuous operation can be selectively discontinued by the user. Control keys 302 can be selected to exit cruise mode if the locked key is physically released, and then pressed again while the cruise control lock control is not currently active. In this case, only this single key is removed from cruise mode. Alternatively, the cruise control lock control can be activated while the key is not physically depressed. In this case, all locked keys are removed from cruise mode.

When the control key 202 is removed from cruise mode, this is reported as released as soon as the control key 202 is physically pressed. If the control key 202 is not physically pressed when the cruise control lock is activated, this is reported as released immediately.

In another aspect, the control key 202 can be pressed when in cruise mode, thereby unlocking the control key 202, and while held, having the cruise control lock reactivated before the control key 202 is released. In this case, no key release is reported. The user can do this to change the set of control keys 202 in cruise mode without reporting a release of specific control keys 202 currently in cruise mode.

An exemplary implementation of the continuous operation of the control command 104, including various additional aspects, is presented with respect to continuous operation in turbo mode. The indicator 402 (e.g., an LED) is provided to give visual feedback when any control keys 302 are currently in turbo mode. As described hereinabove, the indicator 402 can be implemented in other forms such as an onscreen indicator or audio feedback.

The lock key 206 can be a turbo lock and is provided to place one or more control keys 302 into turbo mode. As mentioned hereinabove, other implementations can also be contemplated, including other controls used for this purpose instead of a button, for example, a pattern of pressing the desired button, or a pressure-sensitive button that can detect an especially hard press of the key, or a key combination of other keys.

When the control key 202 is locked in the turbo mode, the keyboard 200 repeatedly delivers press and release events of the control key 202 to the application at a predetermined rate. The control key 202 can be placed in turbo mode by alternate events. One or more of the control keys 302 are pressed and maintained, and then a turbo lock control is activated (e.g., by button or lock key 206). Alternatively, the turbo lock control is activated and maintained, and then one or more of the control keys 302 are pressed.

Either sequence places the selected control key 202 in turbo mode wherein the system repeatedly delivers press and release events to the application at a predetermined rate. Concurrent activation of the control key 202 and turbo lock could be resolved as either of the two above cases.

Continuous operation in turbo mode can be selectively discontinued by the user by alternate events. In one aspect, the locked control key 202 is physically released, and then pressed again while the turbo lock control is not currently active. In this case, this single control key 202 is removed from turbo mode. Alternatively, the turbo lock control can be activated while the control key 202 is not physically depressed. In this case, all locked control keys are removed from turbo mode.

It is to be appreciated that that while one or more control keys 302 are locked at a predetermined rate of the command cycle, the rate can be configurable and changed dynamically during play to suit the needs of gameplay. The command cycle control 208 such as a manual knob can be placed next to the lock key 206 used for turbo mode, or can be formed integrally with the lock key 206. Alternatively, the command cycle control 208 can be settable in software, such as a "buttons up, buttons down" control displayable on the screen.

Turbo rate control can be implemented in a number of ways. In one aspect, a fixed rate can be established at which key press and release events are delivered to the application from the keyboard 200. Alternatively, a settable universal rate can be established at which events are delivered to the gaming application 306. Additionally, variable rates can be established for specific control keys 302, in accordance with gameplay norms or user preferences. Further, the rate control settings can be physically available to vary the rate on the fly during gameplay. Still further, the press versus release periods can be separately varied to have short taps among long delays, long holds with short releases, or any desired sequence of presses and releases so as to give flexible control to the user.

The term "system" can refer to the hardware of the keyboard and the lock controls, and also the keyboard firmware used to communicate the state of the controls to a computer or other processor-driven client system, as well as communication drivers and lower-layer software between the hardware and the application. The tasks presented above can be divided in many ways among these various components depending on the level of complexity that each component can sustain. The term "system" as discussed above can also refer to any other suitable user interface, including a mouse or game controller, and any suitable combination of hardware, firmware, and software used thereof.

The keyboard firmware can also be configured to sense software in order to activate continuous operation. The continuous operation modes can be settable by the client, or externally overridden, so as to conform to a network policy (e.g., at a gaming tournament) in which control capabilities are equalized for all users.

As used in this application, the terms "component" and "system" are intended to refer to a computer-related entity, either hardware, a combination of hardware and software, software, or software in execution. For example, a component can be, but is not limited to being, a process running on a processor, a processor, a hard disk drive, multiple storage drives (of optical and/or magnetic storage medium), an object, an executable, a thread of execution, a program, and/or a computer. By way of illustration, both an application running on a server and the server can be a component. One or more components can reside within a process and/or thread of execution, and a component can be localized on one computer and/or distributed between two or more computers. The word "exemplary" may be used herein to mean serving as an example, instance, or illustration. Any aspect or design described herein as "exemplary" is not necessarily to be construed as preferred or advantageous over other aspects or designs.

Figure 8:
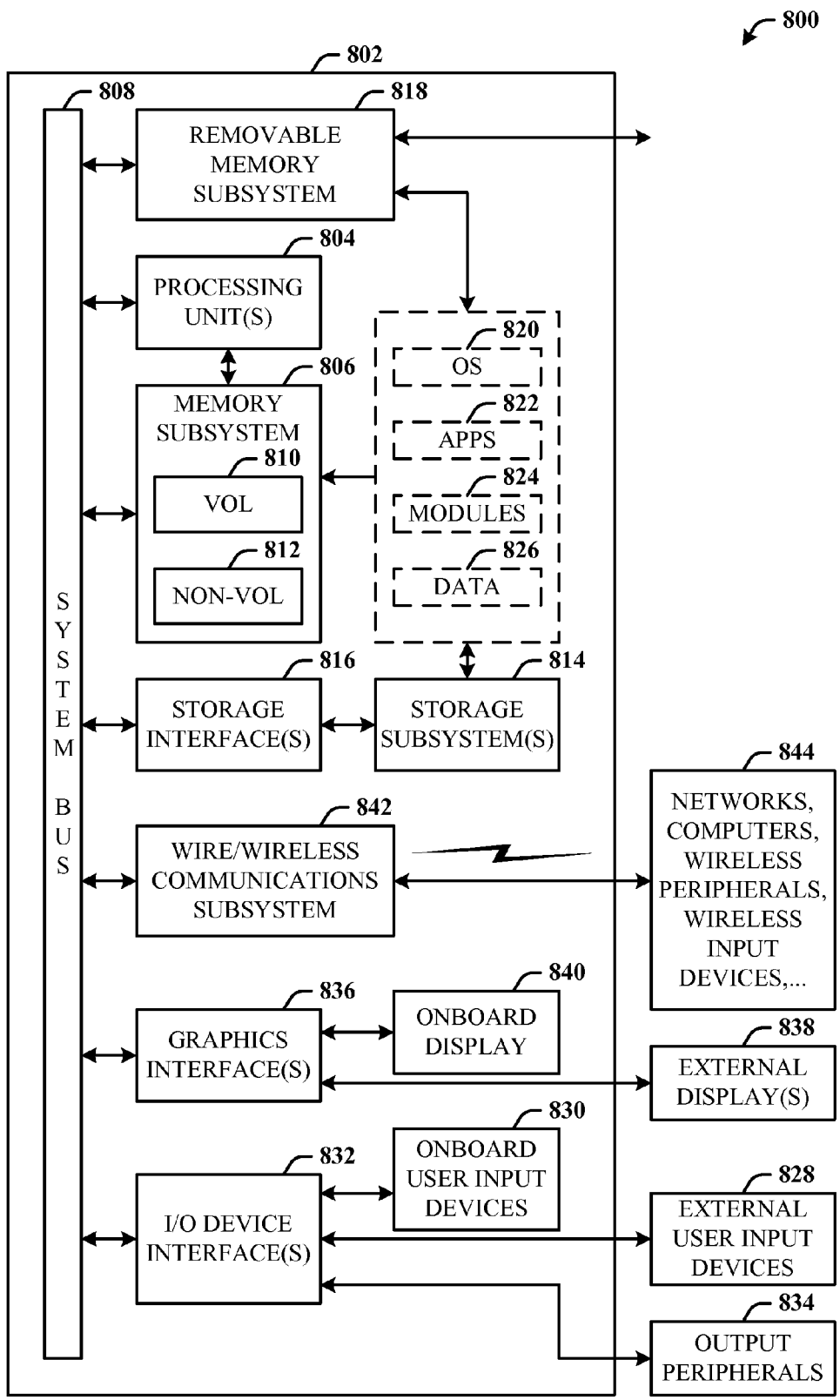
FIG. 8 a block diagram of a computing system operable to interface to the control operation system in accordance with the disclosed architecture.

Referring now to FIG. 8, there is illustrated a block diagram of a computing system 800 operable to interface to the control operation system in accordance with the disclosed architecture. In order to provide additional context for various aspects thereof, FIG. 8 and the following discussion are intended to provide a brief, general description of the suitable computing system 800 in which the various aspects can be implemented. While the description above is in the general context of computer-executable instructions that can run on one or more computers, those skilled in the art will recognize that a novel embodiment also can be implemented in combination with other program modules and/or as a combination of hardware and software.

The computing system 800 for implementing various aspects includes the computer 802 having processing unit(s) 804, a system memory 806, and a system bus 808. The processing unit(s) 804 can be any of various commercially available processors such as single-processor, multi-processor, single-core units and multi-core units. Moreover, those skilled in the art will appreciate that the novel methods can be practiced with other computer system configurations, including minicomputers, mainframe computers, as well as personal computers (e.g., desktop, laptop, etc.), hand-held computing devices, microprocessor-based or programmable consumer electronics, and the like, each of which can be operatively coupled to one or more associated devices.

The system memory 806 can include volatile (VOL) memory 810 (e.g., random access memory (RAM)) and non-volatile memory (NON-VOL) 812 (e.g., ROM, EPROM, EEPROM, etc.). A basic input/output system (BIOS) can be stored in the non-volatile memory 812, and includes the basic routines that facilitate the communication of data and signals between components within the computer 802, such as during startup. The volatile memory 810 can also include a high-speed RAM such as static RAM for caching data.

The system bus 808 provides an interface for system components including, but not limited to, the memory subsystem 806 to the processing unit(s) 804. The system bus 808 can be any of several types of bus structure that can further interconnect to a memory bus (with or without a memory controller), and a peripheral bus (e.g., PCI, PCIe, AGP, LPC, etc.), using any of a variety of commercially available bus architectures.

The computer 802 further includes storage subsystem(s) 814 and storage interface(s) 816 for interfacing the storage subsystem(s) 814 to the system bus 808 and other desired computer components. The storage subsystem(s) 814 can include one or more of a hard disk drive (HDD), a magnetic floppy disk drive (FDD), and/or optical disk storage drive (e.g., a CD-ROM drive DVD drive), for example. The storage interface(s) 816 can include interface technologies such as EIDE, ATA, SATA, and IEEE 1394, for example.

One or more programs and data can be stored in the memory subsystem 806, a removable memory subsystem 818 (e.g., flash drive form factor technology), and/or the storage subsystem(s) 814, including an operating system 820, one or more application programs 822, other program modules 824, and program data 826. Generally, programs include routines, methods, data structures, other software components, etc., that perform particular tasks or implement particular abstract data types. All or portions of the operating system 820, applications 822, modules 824, and/or data 826 can also be cached in memory such as the volatile memory 810, for example. It is to be appreciated that the disclosed architecture can be implemented with various commercially available operating systems or combinations of operating systems (e.g., as virtual machines).

The storage subsystem(s) 814 and memory subsystems (806 and 818) serve as computer readable media for volatile and non-volatile storage of data, data structures, computer-executable instructions, and so forth. Computer readable media can be any available media that can be accessed by the computer 802 and includes volatile and non-volatile media, removable and non-removable media. For the computer 802, the media accommodate the storage of data in any suitable digital format. It should be appreciated by those skilled in the art that other types of computer readable media can be employed such as zip drives, magnetic tape, flash memory cards, cartridges, and the like, for storing computer executable instructions for performing the novel methods of the disclosed architecture.

A user can interact with the computer 802, programs, and data using external user input devices 828 such as a keyboard and a mouse. The external user input devices 828 can include the system 100, keyboard 200 of FIG. 2, keyboard 200 of FIG. 3, the embodiment 400 of FIG. 4, and other user input devices with multi-key capability such as on multi-function mice and game controllers. Other external user input devices 828 can include a microphone, an IR (infrared) remote control, a joystick, a game pad, camera recognition systems, a stylus pen, touch screen, gesture systems (e.g., eye movement, head movement, etc.), and/or the like. The user can interact with the computer 802, programs, and data using onboard user input devices 830 such a touchpad, microphone, keyboard, etc., where the computer 802 is a portable computer, for example. These and other input devices are connected to the processing unit(s) 804 through input/output (I/O) device interface(s) 832 via the system bus 808, but can be connected by other interfaces such as a parallel port, IEEE 1394 serial port, a game port, a USB port, an IR interface, etc. The I/O device interface(s) 832 also facilitate the use of output peripherals 834 such as printers, audio devices, camera devices, and so on, such as a sound card and/or onboard audio processing capability.

One or more graphics interface(s) 836 (also commonly referred to as a graphics processing unit (GPU)) provide graphics and video signals between the computer 802 and external display(s) 838 (e.g., LCD, plasma) and/or onboard displays 840 (e.g., for portable computer). The graphics interface(s) 836 can also be manufactured as part of the computer system board.

The computer 802 can operate in a networked environment (e.g., IP) using logical connections via a wire/wireless communications subsystem 842 to one or more networks and/or other computers. The other computers can include workstations, servers, routers, personal computers, microprocessor-based entertainment appliance, a peer device or other common network node, and typically include many or all of the elements described relative to the computer 802. The logical connections can include wire/wireless connectivity to a local area network (LAN), a wide area network (WAN), hotspot, and so on. LAN and WAN networking environments are commonplace in offices and companies and facilitate enterprise-wide computer networks, such as intranets, all of which may connect to a global communications network such as the Internet.

When used in a networking environment the computer 802 connects to the network via a wire/wireless communication subsystem 842 (e.g., a network interface adapter, onboard transceiver subsystem, etc.) to communicate with wire/wireless networks, wire/wireless printers, wire/wireless input devices 844, and so on. The computer 802 can include a modem or has other means for establishing communications over the network. In a networked environment, programs and data relative to the computer 802 can be stored in the remote memory/storage device, as is associated with a distributed system. It will be appreciated that the network connections shown are exemplary and other means of establishing a communications link between the computers can be used.

The computer 802 is operable to communicate with wire/wireless devices or entities using the radio technologies such as the IEEE 802.xx family of standards, such as wireless devices operatively disposed in wireless communication (e.g., IEEE 802.11 over-the-air modulation techniques) with, for example, a printer, scanner, desktop and/or portable computer, personal digital assistant (PDA), communications satellite, any piece of equipment or location associated with a wirelessly detectable tag (e.g., a kiosk, news stand, restroom), and telephone. This includes at least Wi-Fi (or Wireless Fidelity) for hotspots, WiMax, and Bluetooth™ wireless technologies. Thus, the communications can be a predefined structure as with a conventional network or simply an ad hoc communication between at least two devices. Wi-Fi networks use radio technologies called IEEE 802.11x (a, b, g, etc.) to provide secure, reliable, fast wireless connectivity. A Wi-Fi network can be used to connect computers to each other, to the Internet, and to wire networks (which use IEEE 802.3-related media and functions).

What has been described above includes examples of the disclosed architecture. It is, of course, not possible to describe every conceivable combination of components and/or methodologies, but one of ordinary skill in the art may recognize that many further combinations and permutations are possible. Accordingly, the novel architecture is intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. One or more hardware computer readable storage devices comprising computer-readable instructions that are executable to perform operations comprising:
   controlling operation of a keyboard input device, including:
   enabling operation of a first control input via a first control key of the keyboard input device, the first control key configured to issue a first control command to a software application;
   enabling automatic continuous operation of the first control command via an activation modifier, the activation modifier comprising an input, via the keyboard input device, of a predetermined pattern of key presses of the keyboard input device,
   the predetermined pattern comprising at least two predetermined variations in duration of the key presses,
   the continuous operation comprising repeated issuance of the first control command during the continuous operation of the first control command; and enabling operation of a second control input via the keyboard input device to concurrently issue a second control command to the software application during continuous operation of the first control command, the second control command different than the first control command.

2. The one or more hardware computer readable storage devices of claim 1, the operations further comprising:
issuing a first audio feedback indicator when the first control command is in continuous operation; and
issuing a second audio feedback indicator, concurrently with the first audio feedback indicator, for at least one additional control command in continuous operation concurrently with the first control command.

3. The one or more hardware computer readable storage devices of claim 1, wherein the activation modifier further comprises a lock key configured to be used in combination with the first control input for enabling continuous operation of the first control command.

4. The one or more hardware computer readable storage devices of claim 1, wherein the activation modifier further comprises at least one of a pattern for pressing a control key, a control key pressure-detection state, or a key combination of the control key with at least one other predetermined key.

5. The one or more hardware computer readable storage devices of claim 1, wherein the continuous operation of the first control command comprises issuing the first control command as if the first control input were being continuously depressed.

6. The one or more hardware computer readable storage devices of claim 1, wherein the continuous operation of the first control command further comprises issuing the first control command as if the first control input were being repeatedly pressed and released in a predetermined command cycle.

7. The one or more hardware computer readable storage devices of claim 6, wherein the operations further comprise enabling operation of a command cycle control configured to vary a rate at which the command cycle is repeated.

8. The one or more hardware computer readable storage devices of claim 1, wherein the continuous operation of the first control command comprises issuing the first control command at a turbo mode rate faster than a rate associated with the first control input being continuously depressed.

9. A computer-implemented method for enabling continuation operation of a control command, the method comprising:
issuing a first control command, via a first control key of a keyboard input device, to a gaming software application;
enabling operation of a lock key, the lock key configured to be used in combination with the first control key to enable automatic continuous operation of the first control command, the continuous operation comprising repeated issuance of the first control command during the continuous operation of the first control command;
enabling a second control key of the keyboard input device to concurrently issue a second control command different from the first control command to the gaming software application during the continuous operation of the first control command; and
enabling continuous operation of the first control command or the second control command by detecting a predetermined pattern comprising at least two predetermined variations of press and release periods of the first control key or the second control key associated with the second control command.

10. The computer-implemented method of claim 9, the method further comprising enabling operation of an indicator for indicating whether the continuous operation of the first control command is enabled.

11. The computer-implemented method of claim 10, wherein the indicator further comprises at least one of an indicator light, an onscreen indicator, or an audio feedback indicator.

12. The computer-implemented method of claim 9, the method further comprising enabling the continuous operation of the first control command for a period time based on a timer.

13. The computer-implemented method of claim 9, the method further comprising enabling the lock key to be used in combination with a plurality of control keys of the keyboard input device for enabling continuous operation of each respective control command associated with each respective control key of the plurality of control keys.

14. A system comprising: at least one processor; and
one or more computer readable memory storage hardware devices embodying computer readable instructions which, responsive to execution by the at least one processor, enable the system to implement a method of dynamic control comprising:
issuing a first control command to a software application using a keyboard input device;
selectively enabling automatic continuous operation of the first control command based on detecting an input pattern comprising multiple presses of a first control key of the keyboard input device, the continuous operation comprising repeated issuance of the first control command during the continuous operation of the first control command;
enabling concurrent issuance of second control command to the software application different from the first control command, using a second control key of the keyboard input device, during the continuous operation of the first control command; and
enabling other automatic continuous operations of one or more other control commands from the keyboard input device to be performed via one or more individual input patterns comprising at least variable pressure-detection of respective control keys or predetermined sequences of key presses comprising at least two key presses with predetermined variations in dwell, the other continuous operations comprising repeated issuance of the one or more other control commands during the other continuous operations of the one or more other control commands.

15. The system of claim 14, said method further comprising activating a lock key to enable continuous operation of the first control command.

16. The system of claim 15, said method further comprising concurrently activating the first control key and the lock key to enable continuous operation of the first control command.

17. The system of claim 15, said method further comprising selectively activating one of the first control key and the lock key according to a predetermined order to enable continuous operation of the first control command.

18. The system of claim 14, said method the repeated issuance of the first control command further comprising repeatedly delivering press and release events of the first control key to the software application at a predetermined rate to enable continuous operation of the first control command.

19. The system of claim 18, further comprising issuing the first control command as if the first control key is being continuously depressed.

20. The system of claim 18, said method further comprising issuing the first control command as if the first control key is being repeatedly pressed and released in a predetermined command cycle.

\* \* \* \* \*